United States Patent
Hsiao et al.

(10) Patent No.: US 10,181,441 B2
(45) Date of Patent: Jan. 15, 2019

(54) THROUGH VIA STRUCTURE AND MANUFACTURING METHOD THEREOF

(71) Applicant: TAIWAN SEMICONDUCTOR MANUFACTURING COMPANY LTD., Hsinchu (TW)

(72) Inventors: Cheng-Tai Hsiao, Tainan (TW); Hsun-Chung Kuang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 10 days.

(21) Appl. No.: 15/355,988

(22) Filed: Nov. 18, 2016

(65) Prior Publication Data

US 2018/0145021 A1  May 24, 2018

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 23/528* | (2006.01) | |
| *H01L 23/522* | (2006.01) | |
| *H01L 23/532* | (2006.01) | |
| *H01L 21/768* | (2006.01) | |

(52) U.S. Cl.
CPC ........ *H01L 23/528* (2013.01); *H01L 21/7684* (2013.01); *H01L 21/76802* (2013.01); *H01L 21/76822* (2013.01); *H01L 21/76843* (2013.01); *H01L 21/76856* (2013.01); *H01L 21/76879* (2013.01); *H01L 23/5226* (2013.01); *H01L 23/53266* (2013.01)

(58) Field of Classification Search
CPC ......... H01L 21/76841; H01L 21/76877; H01L 21/0254; H01L 29/513; H01L 2224/73265; H01L 21/283
USPC ................................ 257/750, 751, 758, 767
See application file for complete search history.

(56) References Cited

U.S. PATENT DOCUMENTS

| | | | | |
|---|---|---|---|---|
| 6,339,257 B1* | 1/2002 | Fujiki | ..................... | H01L 24/05 257/751 |
| 8,749,061 B2* | 6/2014 | Yamazaki | ......... | G02F 1/136286 257/66 |
| 9,018,774 B2* | 4/2015 | Lee | ..................... | H01L 23/3114 257/678 |
| 2004/0238955 A1* | 12/2004 | Homma | .................. | H01L 24/03 257/737 |
| 2009/0200674 A1* | 8/2009 | Yang | ................. | H01L 21/76813 257/758 |
| 2011/0095427 A1* | 4/2011 | Goswami | ............ | H01L 21/7681 257/751 |
| 2016/0141250 A1* | 5/2016 | Bao | ................... | H01L 23/53238 257/751 |

* cited by examiner

*Primary Examiner* — S. V. Clark
(74) *Attorney, Agent, or Firm* — WPAT, P.C., Intellectual Property Attorneys; Anthony King

(57) ABSTRACT

A through via structure includes a conductive wiring, at least one dielectric layer over the conductive wiring, a via hole in the at least one dielectric layer and exposing the conductive wiring, and a conductive via in the via hole. The conductive via includes a conductive barrier layer in a bottom portion of the via hole, and a conductive layer in a top portion of the via hole.

20 Claims, 9 Drawing Sheets

THROUGH VIA STRUCTURE AND MANUFACTURING METHOD THEREOF

BACKGROUND

A through via structure is configured as a conductive interconnection to interconnect two conductive structures such as conductive wirings or electrodes disposed on two opposite sides of the dielectric layer or the insulation layer. For high-density package application, the dimension of through via structure has shrank to micron or sub-micron level, and the aspect ratio of the through via structure is accordingly increased. For a via hole with high aspect ratio, however, void or seam tends to occur when filling a conductive layer into the via hole. In addition, corrosion issue due to galvanic effect tends to occur.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
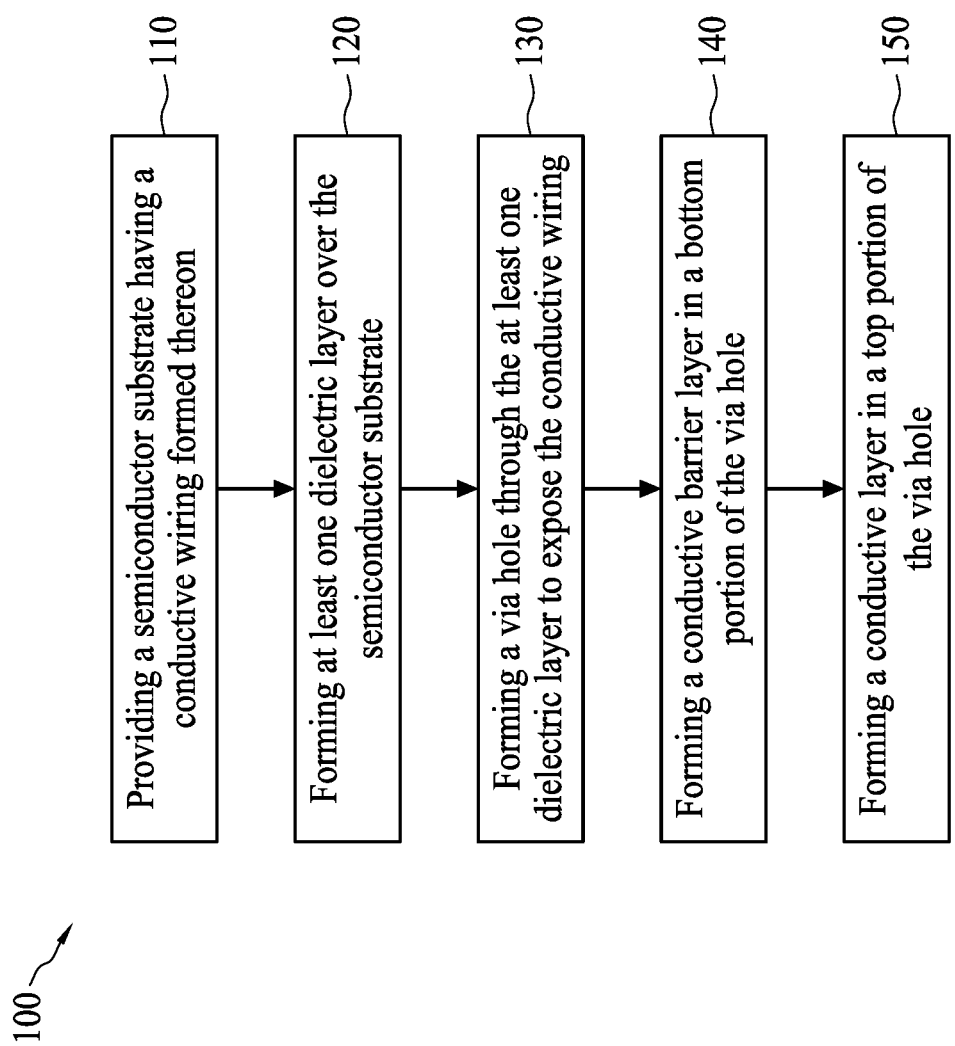
FIG. 1 is a flow chart illustrating a method for manufacturing through via structure according to various aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

As used herein, the term "through via structure" refers to a via structure having a via hole penetrating through at least one structural layer, and a conductive via in the via hole to electrically interconnect other electronic devices disposed on two opposite sides of the structural layer. In one or more embodiments, the through via structure is, but not limited thereto, a bottom electrode via (BEVA) structure configured to electrically connect a bottom electrode of a memory cell.

In one or more embodiments of the present disclosure, a conductive via is formed by stacking a conductive barrier layer and a conductive layer. The conductive via is in contact with a conductive wiring formed underneath and a sidewall of a dielectric layer, and thus no additional adhesion layer is required. Accordingly, a corrosion issue due to galvanic effect is avoided. The conductive barrier layer and the conductive layer may be formed by selective CVD operation, which has improved gap filling ability in comparison with other deposition such as electroplating operation or PVD operation. Thus, void or seam issue is avoided. In addition, the conductive via formed by selective CVD operation requires less amount of CMP loading, which reduces the risk of damaging other structures such as alignment mark and conductive structure in other region of the semiconductor substrate.

Referring to FIG. 1, FIG. 1 is a flow chart illustrating a method for manufacturing through via structure according to various aspects of the present disclosure. The method 100 begins with operation 110 in which a semiconductor substrate having a conductive wiring formed thereon is provided. The method 100 continues with operation 120 in which at least one dielectric layer is formed over the semiconductor substrate. The method 100 proceeds with operation 130 in which a via hole through the at least one dielectric layer is formed to expose the conductive wiring. The method 100 proceeds with operation 140 in which a conductive barrier layer is formed in a bottom portion of the via hole. The method 100 continues with operation 150 in which a conductive layer is formed in a top portion of the via hole.

Figure 2:
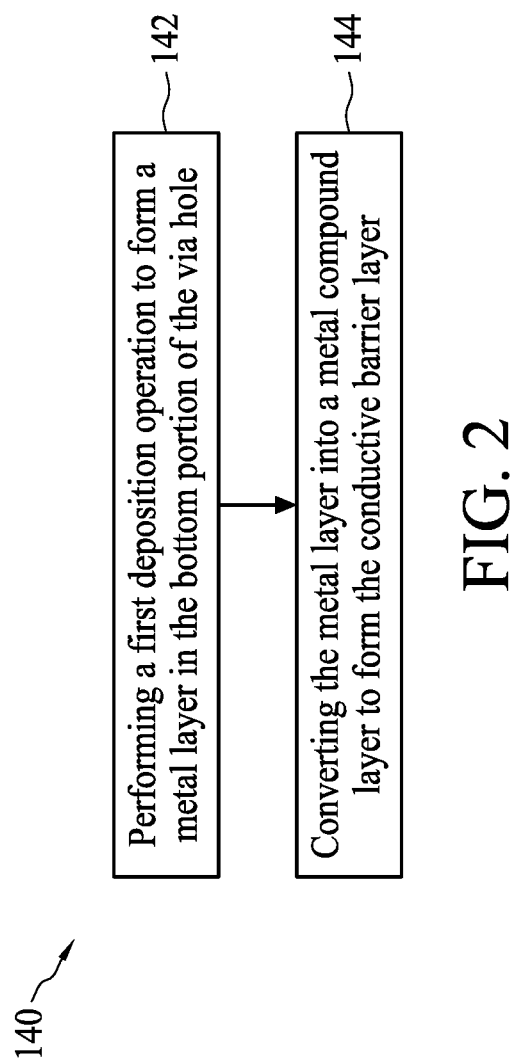
FIG. 2 is a flow chart illustrating operation 140 of the method for manufacturing through via structure according to various aspects of the present disclosure.

Referring to FIG. 2, FIG. 2 is a flow chart illustrating operation 140 of the method for manufacturing through via structure according to various aspects of the present disclosure. In one or more embodiments, the operation 140 includes operation 142 in which a first selective deposition operation is performed to form a metal layer in the bottom portion of the via hole. The operation 140 further includes operation 144 in which the metal layer is converted into a metal compound layer to form the conductive barrier layer.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 3A:
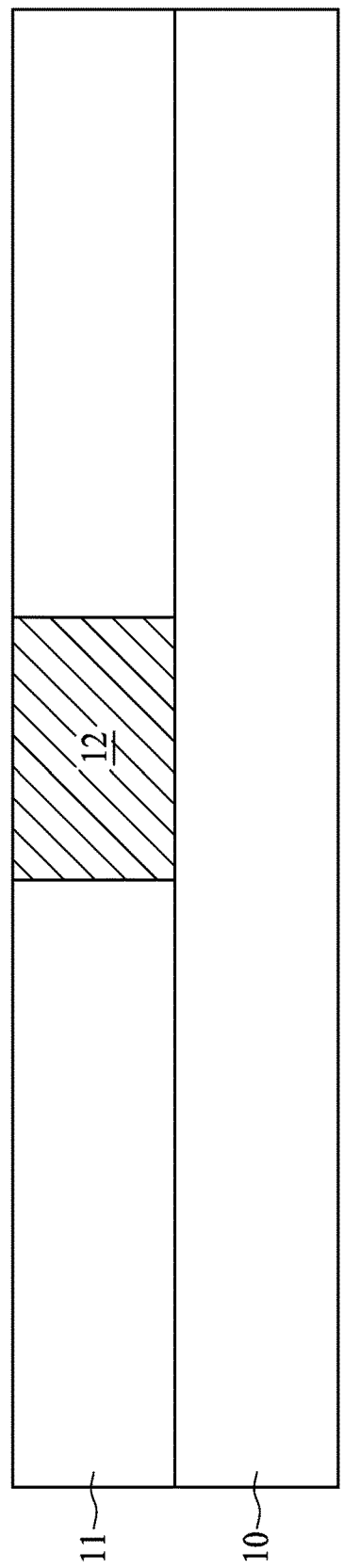
FIGS. 3A, 3B, 3C, 3D, 3E, 3F and 3G are cross-sectional views at one of various operations of manufacturing a through via structure according to one or more embodiments of the present disclosure.

FIGS. 3A, 3B, 3C, 3D, 3E, 3F and 3G are cross-sectional views at one of various operations of manufacturing a through via structure according to one or more embodiments of the present disclosure. As depicted in FIG. 3A and operation 110 in FIG. 1, a semiconductor substrate 10 having a conductive wiring 12 formed thereon is provided. The material of the semiconductor substrate 10 may comprise elementary semiconductor such as silicon or germanium; a compound semiconductor such as silicon germanium, silicon carbide, gallium arsenic, gallium phosphide, indium phosphide or indium arsenide; or combinations thereof. The conductive wiring 12 is formed over the semiconductor substrate 10. In one or more embodiments, the conductive wiring 12 may include, but is not limited to, a conductive wiring embedded in an insulation layer 11. The conductive wiring 12 is exposed from an upper surface of the insulation layer 11. In one or more embodiments, the conductive wiring 12 is a metal wiring such as a copper wiring, but not limited thereto. The material of the conductive wiring 12 may include metal, alloy or other suitable conductive materials. The conductive wiring 12 may be electrically to other devices such as active devices or passive devices formed over the semiconductor substrate 10. In one or more embodiments, the conductive wiring 12 may be an uppermost metal layer of a metal interconnection structure. In one or more embodiments, the insulation layer 11 may include, but is not limited to, an inter-dielectric layer such as a silicon oxide layer, silicon nitride layer, or other inorganic insulation layer or organic insulation layer.

Figure 3B:
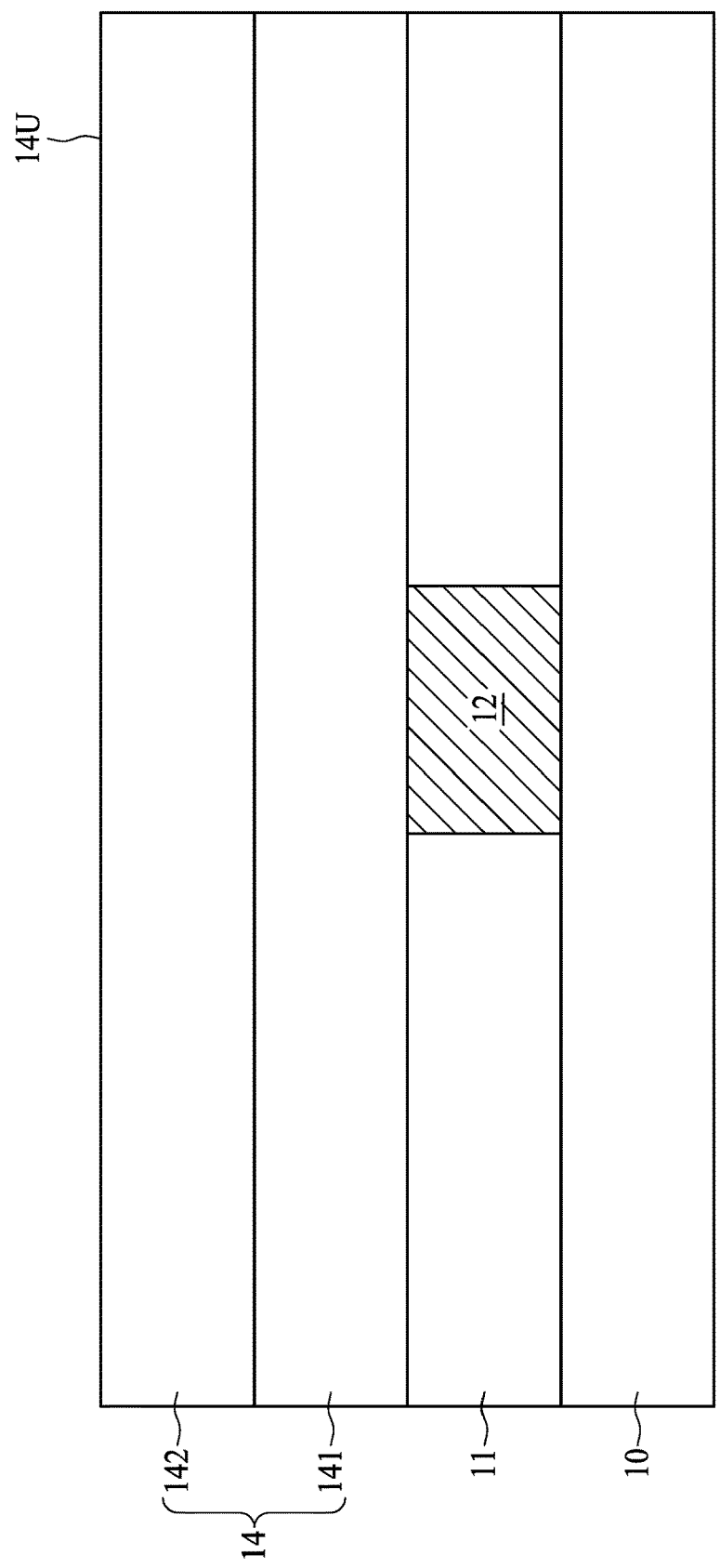

As depicted in FIG. 3B and operation 120 in FIG. 1, at least one dielectric layer 14 is formed over the semiconductor substrate 10. In one or more embodiments, the at least one dielectric layer 14 includes a first dielectric film 141 and a second dielectric film 142 stacked to each other. By way of example, the first dielectric film 141 includes a silicon carbide layer, and the second dielectric film 142 includes a silicon oxide layer. In some embodiments, the thickness of the dielectric layer 14 is substantially between 200 and 1200 angstroms, but not limited thereto. By way of example, the thickness of the first dielectric film 141 is substantially between 100 and 600 angstroms e.g. 250 angstroms, and the thickness of the second dielectric film 142 is substantially between 100 and 600 angstroms e.g. 300 angstroms, but not limited thereto. In one or more embodiments, the at least one dielectric layer 14 may include one dielectric film or more than two dielectric films stacked to one another, and each of the dielectric films is selected from dielectric materials such as silicon oxide, silicon nitride, silicon carbide, or other suitable inorganic dielectric materials or organic dielectric layer. For example, another dielectric film such as a silicon carbide film may be formed over the second dielectric film 142.

Figure 3C:
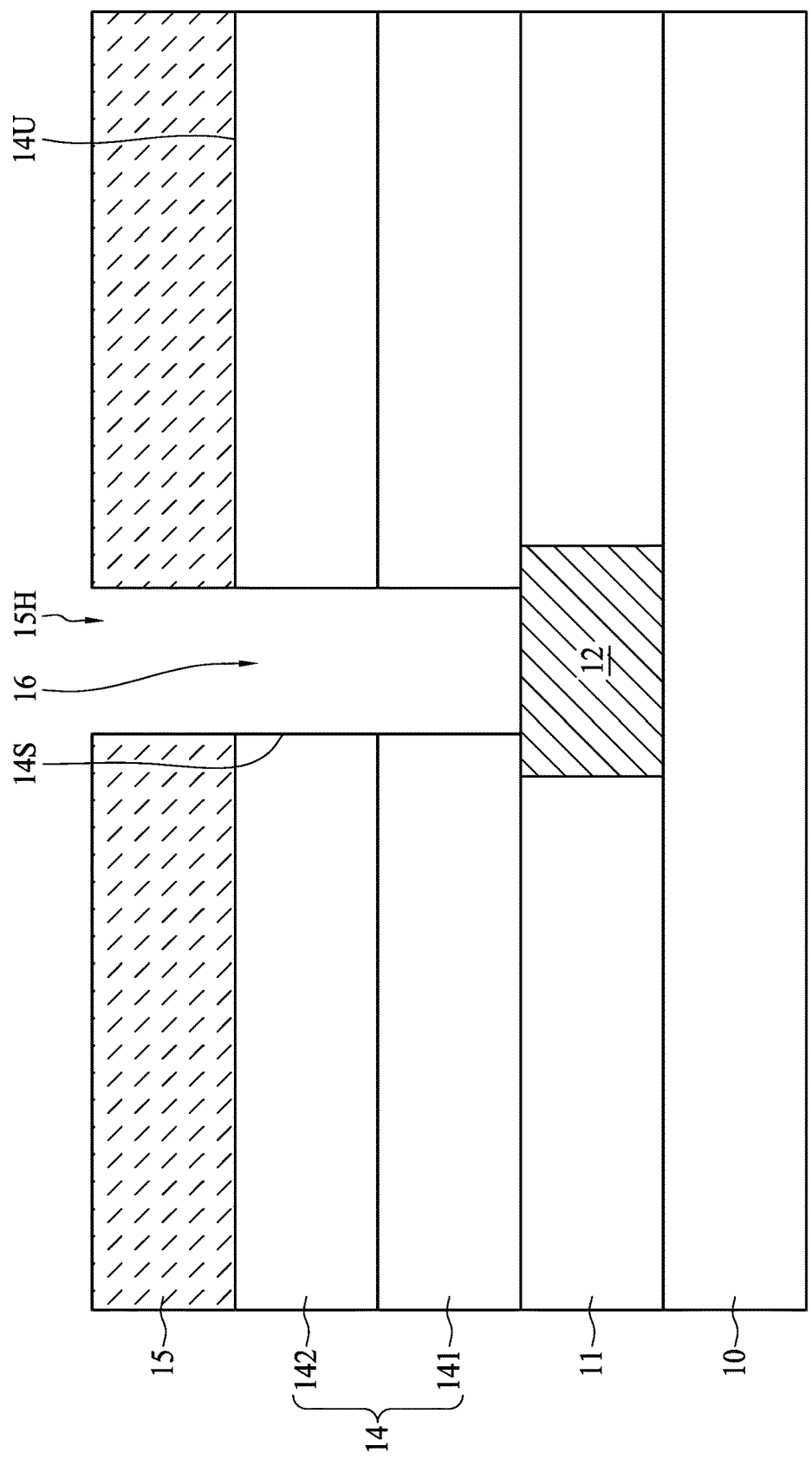

As depicted in FIG. 3C and operation 130 in FIG. 1, a via hole 16 through the at least one dielectric layer 14 is formed to expose the conductive wiring 12. In one or more embodiments, the via hole 16 is formed by photolithography and etching techniques. By way of example, a resist layer 15 such as a photoresist layer is formed over the at least one dielectric layer 14. The resist layer 15 includes an opening 15H exposing a portion of an upper surface 14U of the at least one dielectric layer 14. Subsequently, the at least one dielectric layer 14 is etched through the opening 15H of the resist layer 15 to form a via hole 16. In one or more embodiments, the first dielectric film 141 and the second dielectric film 142 are etched through, and the etching stops at an upper surface of the conductive wiring 12. In one or more embodiments, the aspect ratio of the via hole 16 is greater than 1.5,but not limited thereto. In some embodiments, the sidewall of the via hole 16 is substantially straight perpendicularly or inclined with respect to the upper surface 14U of the at least one dielectric layer 14. In one or more embodiments, the shape of the via hole 16 is substantially a circular shape or a polygonal shape when view from the top.

In one or more embodiments, a surface treatment is performed on the upper surface 14U and a side surface 14S of the at least on dielectric layer 14 through the via hole 16 to clean the upper surface 14Uand the side surface 14S of the at least one dielectric layer 14. In one or more embodiment, the surface treatment is performed to reduce dangling bonds on the upper surface 14U and the side surface 14S of the at least one dielectric layer 14 to facilitate a selective deposition to be performed subsequently. In some embodiments, the surface treatment includes a gaseous surface treatment. By way of example, the gaseous surface treatment includes introducing a gas such as nitrous oxide ($N_2O$), ammonia ($NH_3$), a combination thereof of other suitable gases.

In one or more embodiments, a cleaning operation is performed on the exposed conductive wiring 12. In some embodiments, the cleaning operation is configured to initiate a reduction reaction such as a hydrogen reduction reaction, which is able to reduce metal oxide such as copper oxide to metal such as copper. Compared to metal oxide such as copper oxide, metal such as copper is more conductive. The resist layer 15 is then removed from the at least one dielectric layer 14. In one or more embodiments, the cleaning operation is performed at low temperature to mitigate copper diffusion. For example, the temperature of the cleaning operation is under 400° C.

Figure 3D:
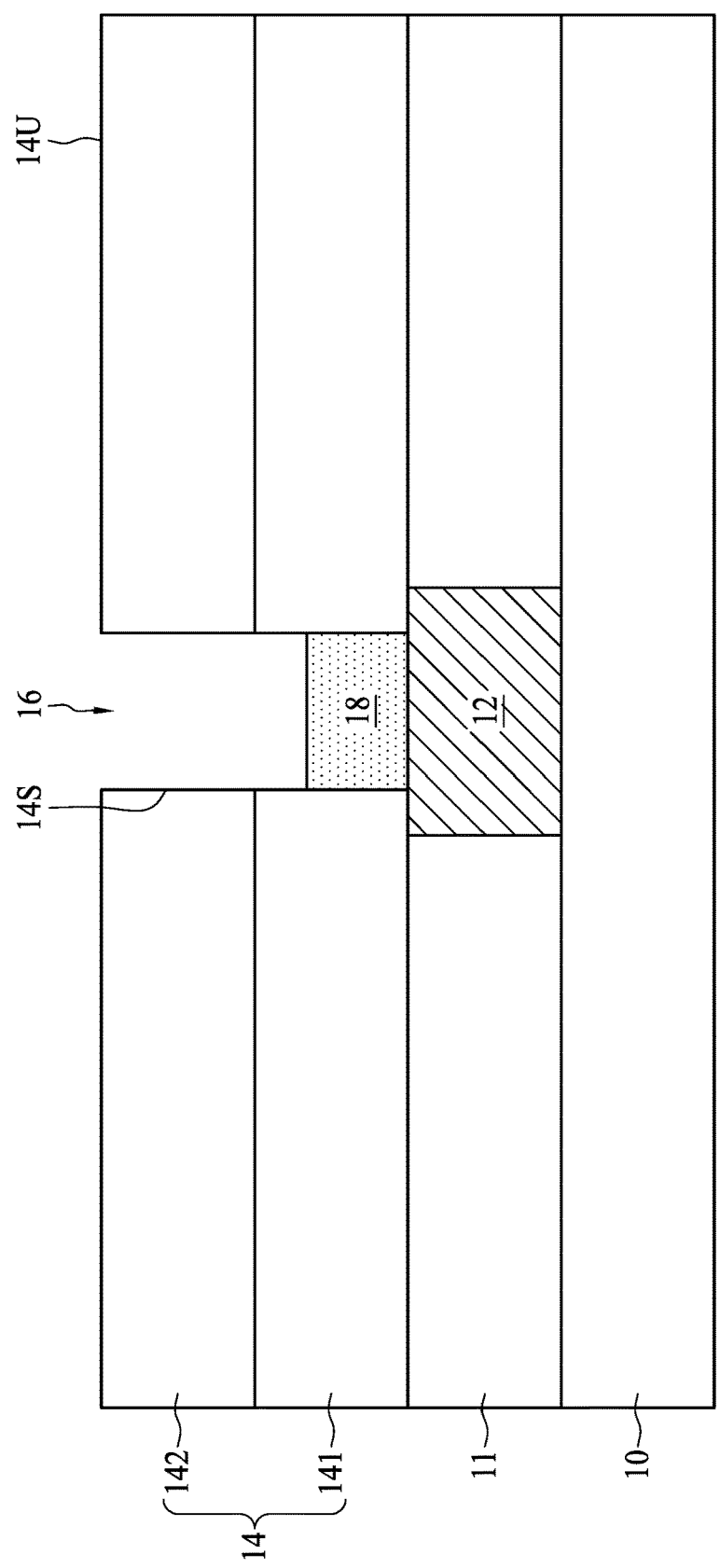
Figure 3E:
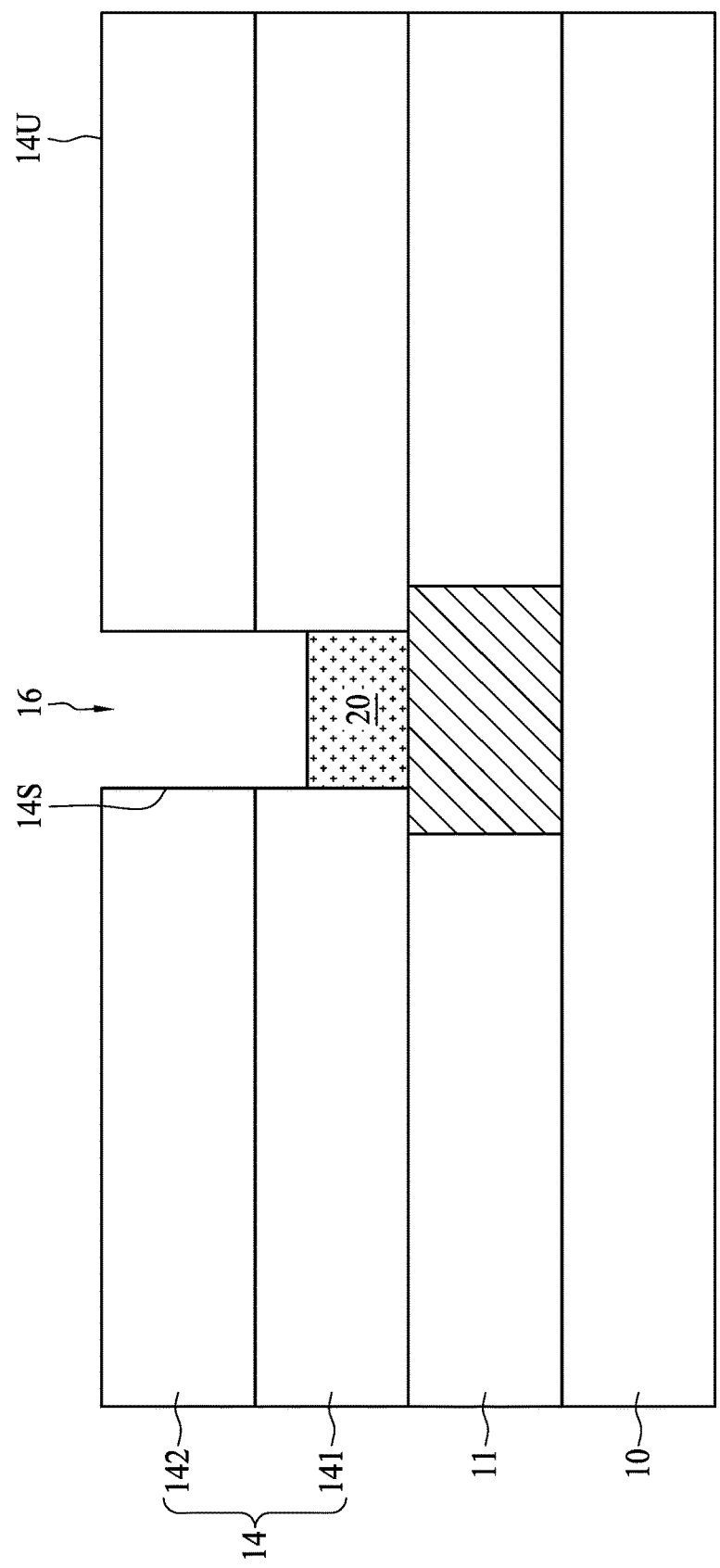

As depicted in FIGS. 3D-3E and operation 140 in FIG. 1, a conductive barrier layer is formed in a bottom portion of the via hole 16. In one or more embodiments, the conductive barrier layer 20 is a metal compound layer, and converted from a metal layer as illustrated in FIG. 2. As depicted in FIG. 3D and operation 142 in FIG. 2, a first selective deposition operation is performed to form a metal layer 18 in the bottom portion of the via hole 16. In one or more embodiments, the first selective deposition operation is a first selective chemical vapor deposition (CVD) operation. In some embodiments, the metal layer 18 is a tungsten (W) layer, but not limited thereto. For example, the material of the metal layer 18 may include titanium (Ti), or other suitable metal or alloy. Since the upper surface 14U and the side surface 14S of the at least one dielectric layer 14 have been treated, the metal layer 18 is selectively formed on the upper surface of the conductive wiring 12 and filled in the bottom portion of the via hole 16 without requiring a patterning operation such as a photolithography operation. As depicted in FIG. 3E and operation 144 in FIG. 2, the metal layer 18 is converted into a metal compound layer to form a conductive barrier layer 20. In one or more embodiments, a plasma treatment is performed to convert the metal layer 18 into the metal compound layer. For example, a plasma treatment using a nitrogen-containing gas such as nitrogen, nitrous oxide, ammonia or a combination thereof is performed to convert the metal layer 18 into a metal nitride layer such as a tungsten nitride layer, serving as the conductive barrier layer 20. The conductive barrier layer 20 is configured to block diffusion of the conductive wiring 12. The conductive barrier layer 20 is formed by selective CVD operation, which has better gap filling ability than electroplating operation or physical vapor deposition (PVD) operation.

Figure 3F:
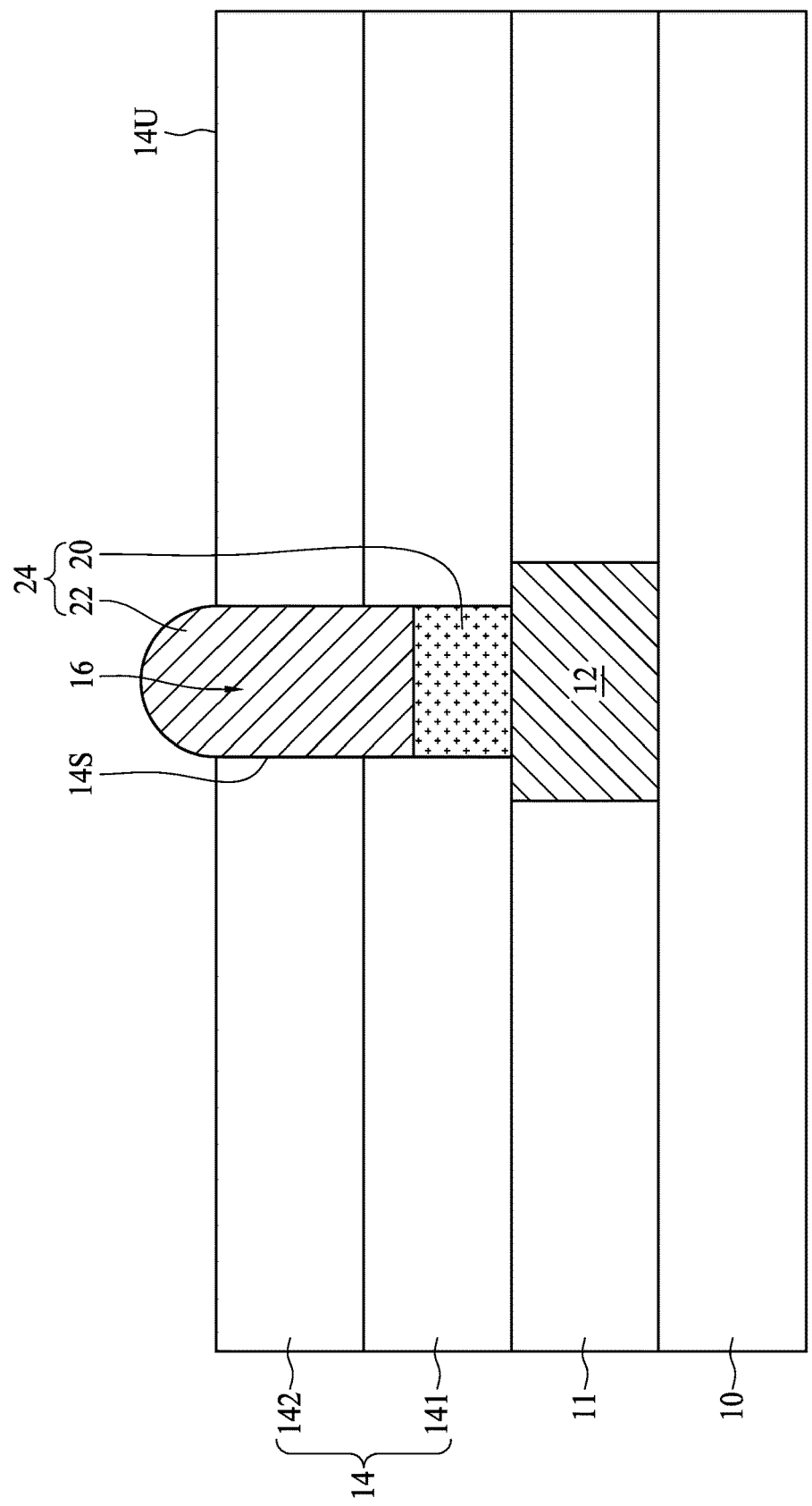
Figure 3G:
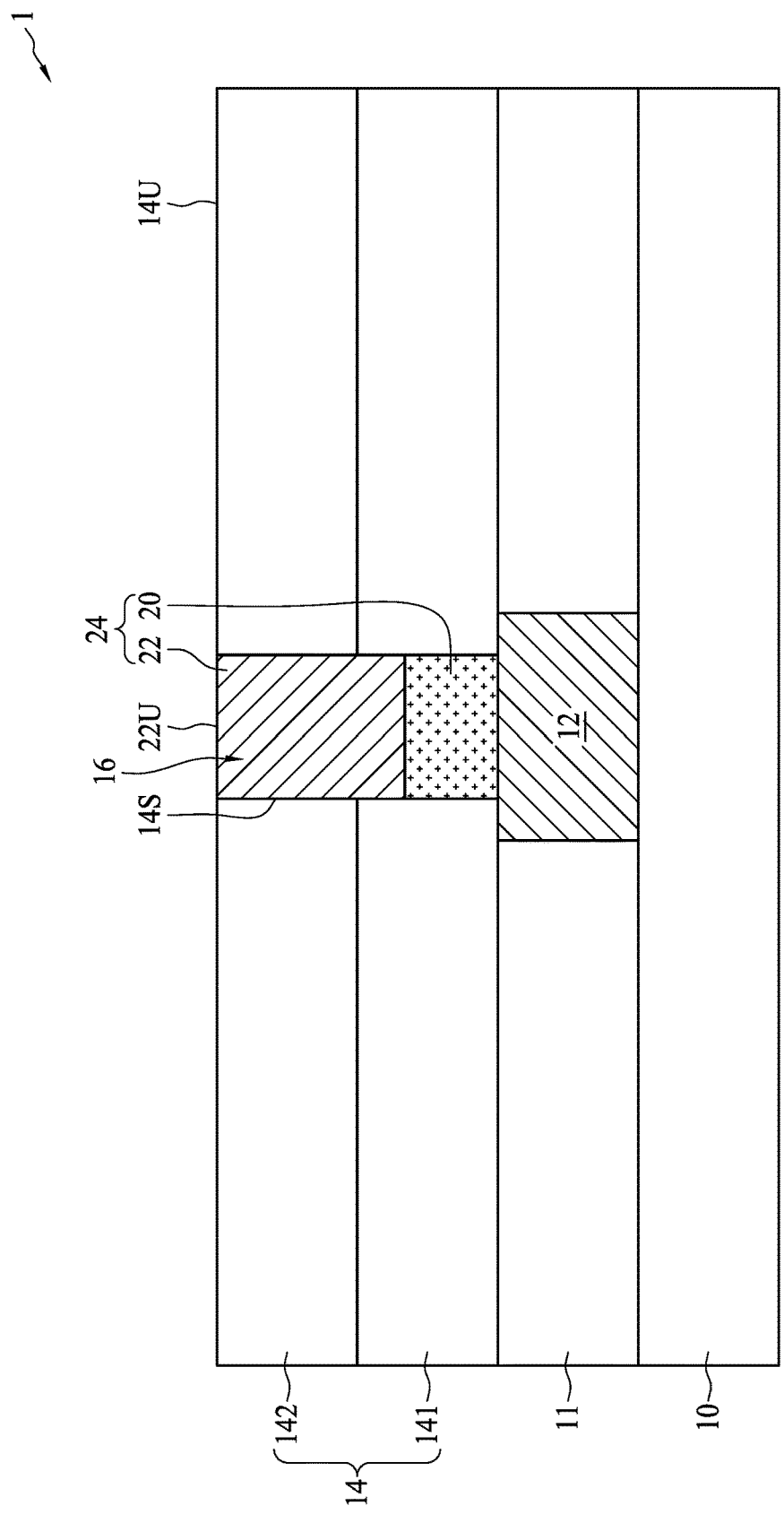

As depicted in FIG. 3F and operation 150 in FIG. 1, a conductive layer 22 is formed in a top portion of the via hole 16. In one or more embodiments, the conductive layer 22 is formed by a second selective deposition operation. In some embodiments, the second selective deposition operation is a second selective CVD operation. In some embodiments, the conductive layer 22 is a tungsten layer, but not limited thereto. The material of the conductive layer 22 may include titanium, or other suitable metal or alloy. The conductive layer 22 in selectively formed on the surface of the conductive barrier layer 20 and filled in the top portion of the via hole 16. The conductive layer 22 is formed by selective CVD operation, which has better gap filling ability compared to electroplating operation or physical vapor deposition (PVD) operation. The conductive barrier layer 20 and the conductive layer 22 together form a conductive via 24. In one or more embodiments, the conductive barrier layer 20 is in contact with the conductive wiring 12 and the side surface 14S of the at least one dielectric layer 14. The conductive layer 22 is in contact with the conductive barrier layer 20 and the side surface 14S of the at least one dielectric layer 14. In other words, no additional adhesion layer (glue layer) is required between the conductive via 24 and the side surface 14S of the at least one dielectric layer 14, and the corrosion issue due to galvanic effect is avoided.

Since the conductive layer 22 is formed by selective deposition operation, a portion of the conductive layer 22 may protrude out of the via hole 16, but the conductive layer 22 does not cover the upper surface 14U of the at least one dielectric layer 14. In one or more embodiments, the conductive layer 22 protruding out of the via hole 16 is removed such that an upper surface 22U of the conductive layer 22 is substantially leveled with the upper surface 14U of the at least one dielectric layer 14. In some embodiments, the protruded conductive layer 22 is removed by a polishing operation such as a chemical mechanical polishing (CMP) operation. As the conductive layer 22 does not cover the upper surface 14U of the at least one dielectric layer 14, only a portion of the conductive layer 22 is polished during the CMP operation. Thus, CMP loading is reduced. Less CMP loading reduces the risk of damaging alignment mark and other conductive structure disposed in other regions of the semiconductor substrate 10. Accordingly, a through via structure 1 is accomplished.

In one or more embodiments, the through via structure 1 is configured as a bottom electrode via structure (BEVA), which is electrically connected to a bottom electrode of a memory cell such as a resistive random access memory (RRAM) cell. In some other embodiments, the through via structure 1 may be configured as a through via structure in other interconnection structures in a semiconductor device.

In the manufacturing method of one or more embodiments of the present disclosure, the conductive via is formed by selective deposition operation such as selective CVD operation, and thus the conductive via has better gap filling ability compared to electroplating operation or physical vapor deposition (PVD) operation. Therefore, void or seam issue is mitigated. In addition, no additional adhesion layer (glue layer) is required between the conductive via and the side surface of the dielectric layer, and thus the corrosion issue due to galvanic effect is avoided. Furthermore, CMP loading is mitigated, which reduces the risk of damaging alignment mark and other conductive structure such as metal wiring of a logic device disposed in peripheral regions of the semiconductor substrate.

In one exemplary aspect, a through via structure includes a conductive wiring, at least one dielectric layer over the conductive wiring, and a conductive via through the at least one dielectric layer. The conductive via includes a conductive barrier layer over and electrically connected to the conductive wiring, and a conductive layer over and electrically connected to the conductive wiring.

In another exemplary aspect, a through via structure includes a metal wiring, at least one dielectric layer over the metal wiring, and a conductive via through the at least one dielectric layer. The conductive via includes a metal nitride layer over and electrically connected to the metal wiring, and a metal layer over the metal nitride layer.

In yet another aspect, a method for manufacturing a through via structure includes providing a semiconductor substrate having a conductive wiring formed thereon, forming at least one dielectric layer over the semiconductor substrate, and forming a via hole through the at least one dielectric layer to expose the conductive wiring. The method further includes forming a conductive barrier layer in a bottom portion of the via hole, and forming a conductive layer in a top portion of the via hole.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A through via structure, comprising:
  a conductive wiring;
  at least one dielectric layer over the conductive wiring, wherein the at least one dielectric layer comprises a first dielectric film over the conductive wiring, and a second dielectric film over an upper surface of the first dielectric film; and
  a conductive via through the at least one dielectric layer, wherein the conductive via comprises:
    a conductive barrier layer over and electrically connected to the conductive wiring, wherein an upper surface of the conductive barrier layer is lower than the upper surface of the first dielectric film; and
    a conductive layer over and electrically connected to the conductive wiring, wherein an upper surface of the conductive layer is substantially leveled with an upper surface of the at least one dielectric layer, and a bottom surface of the conductive layer is adjacent to the upper surface of the conductive barrier layer, and a dimension of the bottom surface of the conductive layer is substantially equal to a dimension of the upper surface of the conductive barrier layer.

2. The through via structure of claim 1, wherein the conductive barrier layer is in contact with the conductive wiring and a side surface of the at least one dielectric layer.

3. The through via structure of claim 1, wherein the conductive layer is in contact with the conductive barrier layer and a side surface of the at least one dielectric layer.

4. The through via structure of claim 1, wherein a material of the conductive barrier layer comprises a metal compound.

5. The through via structure of claim 1, wherein a material of the conductive layer comprises a metal.

6. The through via structure of claim 1, wherein the conductive wiring comprises a metal wiring.

7. A through via structure, comprising:
  a metal wiring;
  at least one dielectric layer over the metal wiring; and a conductive via through the at least one dielectric layer, wherein the conductive via comprises:
   a metal nitride layer over and electrically connected to the metal wiring; and
   a metal layer over the metal nitride layer, wherein an aspect ratio of the conductive via is substantially greater than 1.5.

8. The through via structure of claim 7, wherein the metal nitride layer comprises a tungsten nitride layer, and the metal layer comprises a tungsten layer.

9. The through via structure of claim 7, wherein the metal nitride layer is in contact with the metal wiring and a side surface of the at least one dielectric layer.

10. The through via structure of claim 7, wherein the metal layer is in contact with the metal nitride layer and a side surface of the at least one dielectric layer.

11. The through via structure of claim 7, wherein an upper surface of the metal layer is substantially leveled with an upper surface of the at least one dielectric layer.

12. A through via structure, comprising:
   a semiconductor substrate;
   a conductive wiring over the semiconductor substrate;
   at least one dielectric layer over the conductive wiring, wherein the at least one dielectric layer includes an via hole exposing the conductive wiring; and
   a conductive via, comprising:
      a corrosion inhibiting layer in a bottom portion of the via hole and electrically connected to the conductive wiring; and
      a conductive layer in an upper portion of the via hole and electrically connected to the corrosion inhibiting layer, wherein an aspect ratio of the conductive via is substantially greater than 1.5.

13. The through via structure of claim 12, wherein a sidewall of the via hole is substantially perpendicular with respect to an upper surface of the at least one dielectric layer.

14. The through via structure of claim 12, wherein the corrosion inhibiting layer is in contact with the conductive wiring and a sidewall of the via hole.

15. The through via structure of claim 12, wherein the conductive layer is in contact with the corrosion inhibiting layer and a sidewall of the via hole.

16. The through via structure of claim 12, wherein a material of the corrosion inhibiting layer comprises a metal compound, and a material of the conductive layer comprises a metal.

17. The through via structure of claim 16, wherein the metal compound of the corrosion inhibiting layer comprises the same metal as the metal of the conductive layer.

18. The through via structure of claim 17, wherein the metal compound of the corrosion inhibiting layer comprises metal nitride.

19. The through via structure of claim 1, wherein a bottom surface of the conductive layer is lower than the upper surface of the first dielectric film.

20. The through via structure of claim 1, wherein a sidewall of the conductive via is substantially perpendicular with respect to an upper surface of the at least one dielectric layer.

* * * * *